(12) United States Patent
Boos et al.

(10) Patent No.: US 7,388,235 B2
(45) Date of Patent: Jun. 17, 2008

(54) HIGH ELECTRON MOBILITY TRANSISTORS WITH SB-BASED CHANNELS

(75) Inventors: John Bradley Boos, Springfield, VA (US); Brian R Bennett, Arlington, VA (US); Richard Magno, Waldorf, MD (US); Nicholas A Papanicolou, Potomac, MD (US); Brad P. Tinkham, Berlin (DE)

(73) Assignee: The United States of America as represented by the Secretary of the Navy, Washington, DC (US)

( * ) Notice: Subject to any disclaimer, the term of this patent is extended or adjusted under 35 U.S.C. 154(b) by 9 days.

(21) Appl. No.: 11/239,431

(22) Filed: Sep. 20, 2005

(65) Prior Publication Data
US 2006/0076577 A1 Apr. 13, 2006

Related U.S. Application Data

(60) Provisional application No. 60/615,118, filed on Sep. 30, 2004.

(51) Int. Cl.
*H01L 29/739* (2006.01)
*H01L 31/00* (2006.01)
(52) U.S. Cl. .................... 257/194; 257/192
(58) Field of Classification Search ........... 257/194
See application file for complete search history.

(56) References Cited

U.S. PATENT DOCUMENTS

| | | | | |
|---|---|---|---|---|
| 5,548,140 A | * | 8/1996 | Nguyen et al. | 257/194 |
| 5,663,583 A | * | 9/1997 | Matloubian et al. | 257/192 |
| 5,798,540 A | * | 8/1998 | Boos et al. | 257/194 |
| 6,133,593 A | * | 10/2000 | Boos et al. | 257/194 |
| 6,232,624 B1 | * | 5/2001 | Matloubian et al. | 257/194 |
| 6,316,124 B1 | * | 11/2001 | Boos et al. | 428/642 |
| 2002/0030202 A1 | * | 3/2002 | Liu et al. | 257/194 |

OTHER PUBLICATIONS

T. Ashley, A.B. Dean, C.T. Elliott, R. Jefferies, F. Khaleque and T.J. Phillips, "High Speed, Low-Power InSb Transistors", International Electron Devices Meeting, Technical Digest, pp. 751-754, Dec. 1997.

(Continued)

*Primary Examiner*—Jerome Jackson
*Assistant Examiner*—Anthony Ho
(74) *Attorney, Agent, or Firm*—John J. Karasek; Aisha Ahmad

(57) ABSTRACT

This invention pertains to an electronic device containing a semi-insulating substrate, a buffer layer of an antimony-based material disposed on said substrate, a channel layer of $InAs_ySb_{1-y}$ material disposed on said buffer layer, a barrier layer of an antimony-based disposed on said channel layer, and a cap layer of $InAs_ySb_{1-y}$ material disposed on said barrier layer, wherein the device can have frequency of on the order of 500 GHz and a reduced power dissipation.

20 Claims, 2 Drawing Sheets

Sb-BASED CHANNEL HEMTs

| | | |
|---|---|---|
| n+ $InAs_ySb_{1-y}$ 20-800 Å | CAP LAYER | LAYER 24 |
| UNDOPED $In_xAl_{1-x}As_ySb_{1-y}$ 20-300 Å | BARRIER LAYER | LAYER 22 |
| DOPED $InAs_ySb_{1-y}$ 0-50 Å | DOPED LAYER | LAYER 20 |
| UNDOPED $In_xAl_{1-x}As_ySb_{1-y}$ 20-300 Å | BARRIER LAYER | LAYER 18 |
| UNDOPED $InAs_ySb_{1-y}$ 50-300 Å | CHANNEL LAYER | LAYER 16 |
| UNDOPED $GA_xAl_{1-x}As_ySb_{1-y}$, 0.5-3 μm | BUFFER LAYER | LAYER 14 |
| SI GaAs or InP | SUBSTRATE | LAYER 12 |

OTHER PUBLICATIONS

T. Ashley, A.R. Barnes, L. Buckle, A.B. Dean, M.T. Emeny, M. Fearn, D.G. Hayes, K.P. Hilton, R. Jefferies, T. Martin, K.J. Nash, T.J. Phillips, W.H.A. Tang, P.J. Wilding and R. Chau, "Novel InSb-based Quantum Well Transistors for Ultra-High Speed, Low Power Logic Applications", Proceedings of the 7th International Conference on Solid State and Integrated Circuits Technology, pp. 2253-2256, Oct. 2004.

T. Ashley, A.R. Barnes, S. Datta, A.B. Dean, M.T. Emeny, M.Fearn, S. Hareland, L. Haworth, D.G. Hayes, K.P. Hilton, R. Jefferies, T. Martin, K.J. Nash, T.J. Phillips, W.H.A. Tang and R. Chau, "Ultra High Speed, Very Low Power InSb-based Quantum Wll FETs for Logic Applications", International Semiconductor Device Research Symposium, pp. 196-197, Dec. 2003.

N.A. Papanicolaou, B.R. Bennett, J.B. Boos, D. Park and R. Bass, "Sb-based HEMTs with InAlSb/InAs Heterojunction", Electronics Letters, vol. 41, No. 19, Sep. 15, 2005.

\* cited by examiner

Sb-BASED CHANNEL HEMTs

| | |
|---|---|
| n+ $InAs_ySb_{1-y}$ 20-800 Å | CAP LAYER — LAYER 24 |
| UNDOPED $In_xAl_{1-x}As_ySb_{1-y}$ 20-300 Å | BARRIER LAYER — LAYER 22 |
| DOPED $InAs_ySb_{1-y}$ 0-50 Å | DOPED LAYER — LAYER 20 |
| UNDOPED $In_xAl_{1-x}As_ySb_{1-y}$ 20-300 Å | BARRIER LAYER — LAYER 18 |
| UNDOPED $InAs_ySb_{1-y}$ 50-300 Å | CHANNEL LAYER — LAYER 16 |
| UNDOPED $Ga_xAl_{1-x}As_ySb_{1-y}$ 0.5-3 μm | BUFFER LAYER — LAYER 14 |
| SI GaAs or InP | SUBSTRATE — LAYER 12 |

FIG. 1

HIGH ELECTRON MOBILITY TRANSISTORS WITH SB-BASED CHANNELS

CROSS REFERENCE TO RELATED APPLICATIONS

This application claims the benefit of U.S Provisional Application No. 60/615,118 filed Sep. 30, 2004.

BACKGROUND OF THE INVENTION

1. Field of the Invention

This invention pertains to high electron mobility transistors (HEMTs) that employ advanced material designs.

2. Description of Related Art

Future generations of microwave and millimeter-wave radar, communications, electronic warfare, smart weapons, and imaging systems will require higher precision, smaller size, increased bandwidth, lower operating voltages, and lower cost of production. To meet the demand for improved high-frequency performance, considerable effort within the last 10 years or so has focused on the development of gallium arsenide(GaAs)-based and indium phosphide(InP)-based HEMTs. As a result, a variety of HEMT analog and digital circuits have been fabricated which exhibit higher gain, efficiency, and switching speeds with lower power dissipation. The primary factors responsible for the improved HEMT performance have been the increase in the indium mole fraction in the indium-gallium-arsenide (InGaAs) channel and the increase in the conduction band offset at the 2 DEG interface. As a result of these improvements, InP-based HEMTs have distinct millimeter-wave performance advantages compared to GaAs-based HEMTs, and currently hold the record in current gain cutoff frequency response and noise figure for any three-terminal electronic semiconductor device.

In the longer term, HEMTs which use $In_xAl_{1-x}As_ySb_{1-y}$, $In_xAl_{1-x}P_ySb_{1-y}$, or $Ga_xAl_{1-x}As_ySb_{1-y}$ for the barrier layer and $InAs_ySb_{1-y}$ in the channel may be more attractive than InP-based HEMTs for some of the above applications due to the substantially improved material properties of these new material systems. Higher electron mobility and higher electron velocity may be achieved with a channel composed of $InAs_ySb_{1-y}$. The low electron effective mass in $InAs_ySb_{1-y}$ gives this material a significant advantage in the room-temperature mobility which can be achieved for a given HEMT sheet charge density. $InAs_ySb_{1-y}$-based channel materials also have the substantial advantage of a higher electron peak velocity, i.e., $5\times10^7$ cm/sec, for pure InSb, compared to the other semiconductors. The large conduction band discontinuity at the donor layer/channel interface enables the formation of a deep quantum well and the associated benefits of a large 2 DEG sheet charge density, good carrier confinement, and high modulation efficiency. These features should enable improved scaling of the current-gain cutoff frequency ($f_T$) as the gate length is reduced to the nanometer range. In addition to the increased high-frequency performance potential, $InAs_ySb_{1-y}$ channel HEMTs are also attractive for applications requiring low-voltage operation. The higher electron mobility and velocity, lower threshold field and reduced access resistance capability enable the attainment of higher effective velocity at a significantly lower drain voltage.

Although improvements have been made in recent years, the material growth and fabrication technology for antimony-based HEMTs is relatively immature. For the case of AlSb/InAs HEMTs, the high reactivity of AlSb in air and the low valence-band offset of the AlSb/InAs heterojunction increase the complexity of the material growth and device design requirements. For HEMTs with $InAs_ySb_{1-y}$ channels, barrier layers composed of $In_xAl_{1-x}As_ySb_{1-y}$, $In_xAl_{1-x}P_ySb_{1-y}$, or $Ga_xAl_{1-x}As_ySb_{1-y}$ are required. HEMTs with $InAs_ySb_{1-y}$ channels, however, are susceptible to significant charge control problems associated with impact ionization in the channel due to the narrow bandgaps of these materials. These effects become increasingly pronounced as the gate length is reduced due to the higher fields present, thus hindering the high-frequency performance of short-gate length HEMTs and limiting their operating voltage range. The combination of Sb-based materials in the channel offers unique opportunities to reduce impact ionization effects by using composite channel layer designs. What is disclosed herein are high electron mobility transistors that employ advanced material designs to increase operating speed and reduce power dissipation.

OBJECTS AND BRIEF SUMMARY OF THE INVENTION

It is an object of this invention to provide transistors that employ advanced material designs to increase operating speeds.

It is another object of this invention to provide high electron mobility transistors that employ advanced material designs to reduce power dissipation.

It is another object of this invention to provide high electron mobility transistors that are based on antimony-containing materials.

It is another object of this invention to provide high electron mobility transistors that exhibit improved frequency performance while operating at lower bias voltage.

It is another object of this invention to provide high electron mobility transistors wherein layers of the transistors use $In_xAl_{1-x}As_ySb_{1-y}$, $In_xAl_{1-x}P_ySb_{1-y}$, or $Ga_xAl_{1-x}As_ySb_{1-y}$ materials in the buffer and the barrier layers It is another object of this invention to provide high electron mobility transistors wherein channel layers use $InAs_ySb_{1-y}$ materials or $InAs_ySb_{1-y}$ and a combination of Sb-based materials.

It is another object of this invention to provide transistors that produce low noise figures.

It is another object of this invention to provide high electron mobility transistors that are particularly suitable for high speed and low noise applications.

It is another object of this invention to provide transistors which can operate at switching speed of on the order of 500 GHz or higher at reduced power dissipation compared to comparable prior art devices.

These and other objects of this invention can be attained by high mobility transistors that utilize $In_xAl_{1-x}As_ySb_{1-y}$, $In_xAl_{1-x}P_ySb_{1-y}$, or $Ga_xAl_{1-x}As_ySb_{1-y}$ in the barriers and $InAs_ySb_{1-y}$ in the channel.

BRIEF DESCRIPTION OF THE DRAWINGS

FIG. 1 is a cross-sectional schematic representation of a layer design diagram of the high electron mobility transistors of this invention.

DETAILED DESCRIPTION OF THE INVENTION

Figure 2:
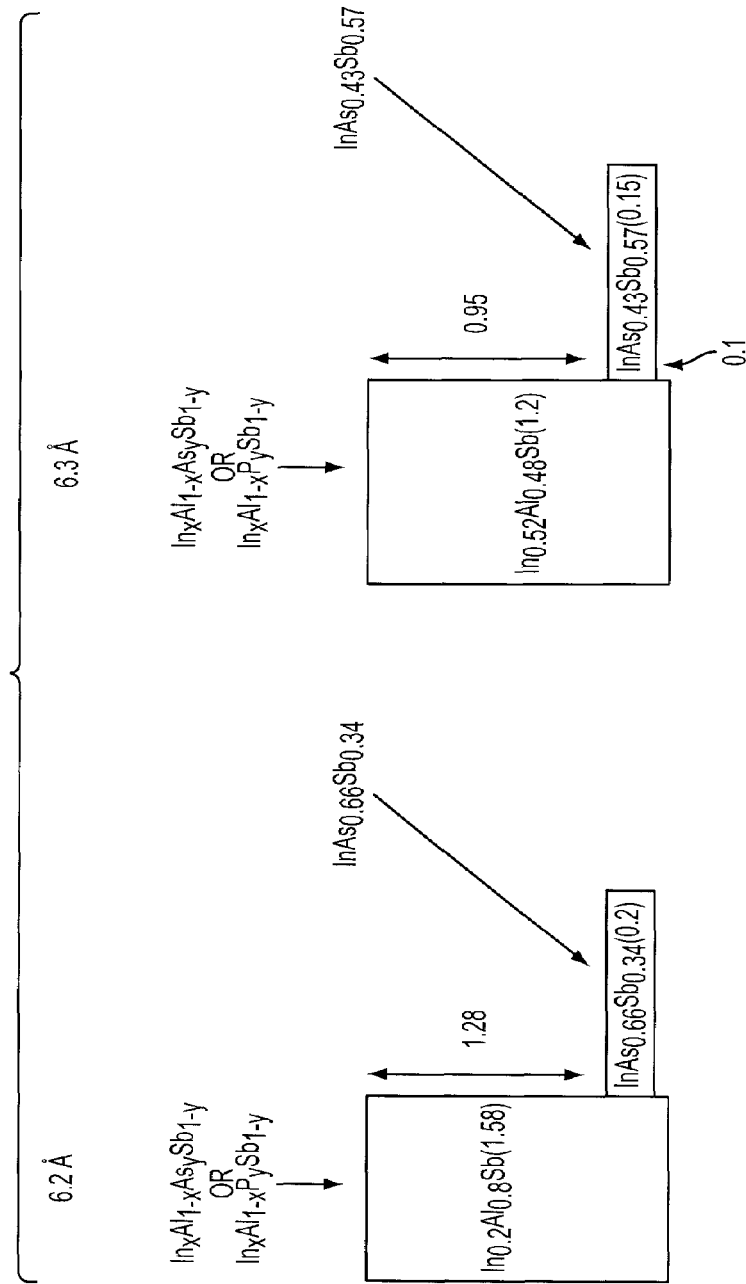
FIG. 2 is a band diagram of the type I $InAs_ySb_{1-y}$ high electron mobility transistors of this invention for lattice constants of 6.2 Å and 6.3 Å.

High electron mobility transistors of this invention employ advanced material layer designs that can increase operating speed to over 500 GHz and reduce power dissipation by a factor of at least two. The HEMTs utilize $In_xAl_{1-x}As_ySb_{1-y}$, $In_xAl_{1-x}P_ySb_{1-y}$, or $Ga_xAl_{1-x}As_ySb_{1-y}$ for the barrier layer and $InAs_ySb_{1-y}$ in the channel. As a result, the devices exhibit improved frequency performance while operating at lower bias voltage.

More specifically, the HEMTs of this invention include, as shown in FIG. 1, a semi-insulating GaAs or InP substrate 12, buffer layer 14 of undoped $In_xAl_{1-x}As_ySb_{1-y}$, $In_xAl_{1-x}P_ySb_{1-y}$, or $Ga_xAl_{1-x}As_ySb_{1-y}$ disposed on the substrate, channel layer 16 through which electrons flow horizontally, as depicted in FIG. 1, of undoped $InAs_ySb_{1-y}$ disposed on the buffer layer, first barrier layer 18 of undoped $In_xAl_{1-x}As_ySb_{1-y}$, $In_xAl_{1-x}P_ySb_{1-y}$, or $Ga_xAl_{1-x}As_ySb_{1-y}$ disposed on the channel layer, silicon or tellurium-doped layer 20 of $InAs_ySb_{1-y}$, $In_xAl_{1-x}As_ySb_{1-y}$, $In_xAl_{1-x}P_ySb_{1-y}$, or $Ga_xAl_{1-x}As_ySb_{1-y}$ disposed on the first barrier layer, second barrier layer 22 of undoped $In_xAl_{1-x}As_ySb_{1-y}$, $In_xAl_{1-x}P_ySb_{1-y}$, or $Ga_xAl_{1-x}As_ySb_{1-y}$ disposed on the silicon or tellurium-doped layer, and cap layer 24 of undoped or n-type doped $InAs_ySb_{1-y}$ disposed on the second barrier layer. In a preferred embodiment, the barrier layer is composed of the following materials with the indicated mol fractions of x and y as follows: $In_xAl_{1-x}As_ySb_{1-y}$, $In_xAl_{1-x}P_ySb_{1-y}$, or $Ga_xAl_{1-x}As_ySb_{1-y}$ where x varies from 0 to 0.7 and y varies from 0 to 0.3. In a preferred embodiment, the channel layer is composed of the following materials with the indicated mole fractions of x and y as follows: $InAs_ySb_{1-y}$ where x varies from 0 to 0.8. Thickness of the various layers is typically in the following ranges:

| | |
|---|---|
| substrate 12, | 500-25 μm |
| buffer 14, | 0.5-3 μm |
| channel 16, | 50-300 Å |
| first barrier 18, | 20-300 Å |
| doped layer 20, | 0-50 Å |
| second barrier 22, | 20-300 Å |
| cap layer 24, | 20-800 Å |

The two barrier layers can be combined with the doped layer disposed somewhere therein, typically around the middle thereof. Although the barrier is not as important as the channel, in terms of electron transport which is the key here, and its bandgap should be wider than that of the channel. The barrier is extremely important in the scheme of these transistors and their growth must be such as to avoid forming traps and defects. Therefore, knowledge of the growth of the barrier and other layers is not trivial. It is the barrier and the channel layers that characterize HEMTs.

Function of the substrate is obviously to provide support for the layers disposed thereon. Commercially available substrates are GaAs or InP and their lattice constants are in the range of 5.7-5.9 Å.

Function of the buffer layer is to change lattice constant of the substrate to the lattice constant of the barrier or channel material and it is the buffer layer that sets the lattice constant of the materials disposed above it by choosing mole fractions of the first barrier, or the barrier in general. The lattice constant of the buffer layer is typically 6.1-6.3 Å.

Function of the channel layer is to conduct or transport the speeding electrons, which determines maximum operational speed of a HEMT.

Function of the barrier layer is to put a metal electrode on the HEMT which can gate the electrons flowing to the channel since if the gate were to be placed in the channel, there would not be an electrostatic barrier there. The barrier layer is needed to isolate the gate metal from the channel, which allows channel modulation through application of gate voltage.

Typically, dopants are needed in the barrier layer which contribute their electrons to the channel, which increases conductivity of the channel. So, in these types of transistors, there is typically a doped layer in the barrier, herein denoted as the first barrier. Dopants include silicon or tellurium ions. The silicon or tellurium ions provide electrons to form an n-type channel. High or heavy doping is considered to be doping on the order of $1 \times 10^{19}$ e/cm$^3$ and low doping is on the order of $1 \times 10^{16}$ e/cm$^3$.

In reference to fabrication of the HEMT device, the HEMT material can be grown metamorphically on a semi-insulating GaAs or InP substrate by molecular beam epitaxy. After the growth of a thick $In_xAl_{1-x}As_ySb_{1-y}$, $In_xAl_{1-x}P_ySb_{1-y}$, or $Ga_xAl_{1-x}As_ySb_{1-y}$ buffer layer to accommodate the lattice mismatch, a channel layer containing $InAs_ySb_{1-y}$ or a combination of $InAs_ySb_{1-y}$ and other Sb-based materials is grown next, followed by an $In_xAl_{1-x}As_ySb_{1-y}$, $In_xAl_{1-x}P_ySb_{1-y}$, or $Ga_xAl_{1-x}As_ySb_{1-y}$ barrier layer and an $InAs_ySb_{1-y}$ cap layer. The bandgaps and band alignments for these material combinations were obtained using data from 8-band k-p simulations. The channel can be modulation doped in the conventional way using donor atoms in the barrier layers, or it can be modulation doped through the use of a thin, on the order of 12 Å, $InAs_ySb_{1-y}$ layer which is doped with silicon or tellurium ions. If required, a thin $In_xAl_{1-x}As$ layer can also be grown above the barrier layer to enable a gate recess etch to be performed.

For a basic disclosure on the general fabrication of a device of this nature, see Boos et al U.S. Pat. No. 5,798,540, the entire contents of which is incorporated herein by reference.

HEMTs with $InAs_ySb_{1-y}$ channels potentially have very attractive advantages compared to conventional GaAs or InP-based HEMTs. The key feature of this new design is the use of $In_xAl_{1-x}As_ySb_{1-y}$, $In_xAl_{1-x}P_ySb_{1-y}$, or $Ga_xAl_{1-x}As_ySb_{1-y}$ for the barrier layer and $InAs_ySb_{1-y}$ for the channel. Higher mobility in the channel can be achieved using $InAs_ySb_{1-y}$ material compared to InGaAs material. The higher mobility will result in lower source and drain resistance and improved charge transport. The lower ohmic contact resistance to the $InAs_ySb_{1-y}$ channel due to the lower bandgap of these materials will reduce the source-drain low field resistance further and facilitate the formation of non-alloyed ohmic contacts. Low source and drain resistance is one of the most important requirements for high-speed operation in HEMTs. HEMT designs using $In_xAl_{1-x}As_ySb_{1-y}$, $In_xAl_{1-x}P_ySb_{1-y}$, or $Ga_xAl_{1-x}As_ySb_{1-y}$ for the barrier layer and $InAs_ySb_{1-y}$ for the channel can also be optimized for large conduction and valence band offsets by adjusting the material compositions. The preliminary band diagrams that show the composition of the HEMTs for the lattice constants of 6.2 Å and 6.3 Å are shown in FIG. 2. In addition to the increased high-speed performance potential, $InAs_ySb_{1-y}$ channel HEMTs are also attractive for applications requiring low-collector voltage operation. The high peak velocity at low electric field of $InAs_ySb_{1-y}$ enables the HEMT to operate at a lower drain voltage thus reducing power dissipation.

Other key features of the new HEMT design is the use of an optional subchannel layer composed of $InAs_ySb_{1-y}$, $In_xGa_{1-x}Sb$ or other Sb-based materials under the main channel to reduce impact ionization in the device. The addition of this layer improves the performance of the HEMTs, particularly for gate lengths in the deep-submicron regime. Composite channel designs have previously been used in InP-based HEMTs to increase breakdown voltage. Electrons are transferred from the main channel to the subchannel before gaining enough kinetic energy for impact ionization. Electrons can also undergo real space transfer to the subchannel. As a result, the extent of impact ionization in the channel is reduced. By being able to vary the alloy composition and thickness, a wide range of possibilities exist to reduce impact ionization in the device.

AlSb/InAs HEMTs are particularly susceptible to gate leakage current due to the type II staggered band lineup of the AlSb/InAs heterojunction. As a result, there exists only a minimal valence band barrier to limit hole flow into the adjacent barrier and buffer layers. AlSb/InAs HEMTs reported thus far suffer from high gate leakage current due to the relatively poor insulating quality of the thin barrier layer and the large number of holes that are present in the channel due to impact ionization at relatively low drain voltages. A substantial portion of these impact-ionization generated holes surmount or tunnel through the small gate barrier present and appear as additional gate leakage current. Reduction of the gate current is essential for low-noise performance. The microwave noise measured on previous AlSb/InAs HEMTs was dominated by the gate leakage current shot noise. By reducing the extent of gate leakage current resulting from holes generated by impact ionization, the noise performance can be improved. The use of $In_xAl_{1-x}As_ySb_{1-y}$, $In_xAl_{1-x}P_ySb_{1-y}$, or $Ga_xAl_{1-x}As_ySb_{1-y}$ for the barrier layer and $InAs_ySb_{1-y}$ for the channel will increase the valence band offset, thus reducing the gate leakage current.

The material growth and fabrication technology for HEMTs with an $In_xAl_{1-x}As_ySb_{1-y}$, $In_xAl_{1-x}P_ySb_{1-y}$, or $Ga_xAl_{1-x}As_ySb_{1-y}$ barrier layer and $InAs_ySb_{1-y}$ channel layers has been demonstrated. Better determinations of the appropriate compositions for the different layer structures are also required to optimize performance. HEMT performance with these improved material design features is expected to improve considerably compared to InP-based and GaAs-based HEMTs that are currently available. The unique combinations of these new material heterostructure designs will make $InAs_ySb_{1-y}$ channel HEMTs attractive candidates in future technologies where high speed, gain, and efficiency at low bias voltage will be required.

While presently preferred embodiments have been shown of the novel high electron mobility transistor, and of the several modifications discussed, persons skilled in this art will readily appreciate that various additional changes and modifications can be made without departing from the spirit of the invention as defined and differentiated by the following claims.

What is claimed:

1. An electronic device comprising:
   a semi-insulating substrate;
   a buffer layer disposed on said substrate;
   a channel layer disposed on said buffer layer;
   a barrier layer disposed on said channel layer; and
   a cap layer disposed on said barrier layer;
   wherein said barrier layer comprising $ZAl_{1-x}WSb_{1-y}$, and Z is selected from the group consisting of $In_x$ and $Ga_x$ and W is selected from the group consisting of $As_y$ and $P_y$,
   wherein said channel layer comprising $InAs_ySb_{1-y}$,
   wherein in said barrier layer said x varies from greater than 0 to approximately 0.7 and y varies approximately from 0 to 0.3.

2. The device of claim 1, wherein said buffer layer, said channel layer, and said barrier layer are undoped.

3. The device of claim 1 wherein said barrier layer includes a thin doped layer, the dopant consisting essentially of silicon, tellurium and mixtures thereof.

4. The device of claim 1, wherein said barrier layer includes an $InAs_ySb_{1-y}$ doped layer.

5. The device of claim 1 wherein said cap layer is doped on the order $1 \times 10^{19}$ cm$^{-3}$ ions selected from the group consisting essentially of silicon, tellurium and mixtures thereof.

6. The device of claim 1, wherein said channel includes a sub-channel of an Sb-based material.

7. The device of claim 1, wherein said cap layer is selected from the group consisting of doped and undoped $InAs_ySb_{1-y}$ material, wherein the dopant silicon, tellurium and mixtures thereof.

8. The device of claim 1, wherein said barrier layer comprises a dopant selected from the group consisting essentially of silicon, tellurium and mixtures thereof.

9. The device of claim 1, wherein said barrier layer includes an $In_xAl_{1-x}As_ySb_{1-y}$ layer to reduce gate leakage current.

10. The device of claim 1, wherein said substrate comprises a thickness of 500 to 25 μm; said buffer layer comprises a thickness of 0.5 to 3 μm; said channel layer comprises a thickness of, 20-300 Å; said barrier layer comprises a thickness of 20-600 Å, said silicon or tellurium-doped layer in said barrier layer comprises a thickness of 0-50 Å; and said cap layer comprises a thickness of 20-800 Å.

11. The electronic device of claim 1, wherein said channel layer comprises InAs.

12. A high electron mobility device comprising:
    a semi-insulating substrate;
    a buffer layer disposed on said substrate;
    a channel layer material comprising $InAs_ySb_{1-y}$ wherein y is greater than 0 said channel layer disposed on said buffer layer;
    a barrier layer comprising InAlSb, disposed on said channel layer; and
    a cap layer of $InAs_ySb_{1-y}$ wherein y is greater than 0 disposed on said barrier layer.

13. The high electron mobility device of claim 12, wherein said barrier layer includes a thin doped layer, the dopant comprises silicon, tellurium and mixtures thereof.

14. The high electron mobility device of claim 12, wherein said channel layer includes a sub-channel layer of 5 to 200 Å thick of an Sb-based material disposed under said channel layer.

15. The high electron mobility device of claim 12, wherein said cap layer is selected from the group consisting of doped and undoped $InAs_ySb_{1-y}$ material, wherein the dopant consisting essentially of silicon, tellurium and mixtures thereof.

16. The high electron mobility device of claim 12, wherein said buffer layer material is selected from the group consisting of $In_xAl_{1-x}As_ySb_{1-y}$, $In_xAl_{1-x}P_ySb_{1-y}$, and $Ga_xAl_{1-x}As_ySb_{1-y}$ and said channel is $InAs_ySb_{1-y}$.

17. The high electron mobility device of claim 12, wherein said barrier layer material is $In_xAl_{1-x}As_ySb_{1-y}$, and said cap layer is selected from the group consisting of Sb-based material.

18. The high electron mobility device of claim 12, wherein said cap layer is highly doped with ions selected from the group consisting of silicon, tellurium, and mixtures thereof, and said cap layer is highly doped to the level of on the order of $1\times10^{19}$ cm$^{-3}$.

19. The high electron mobility device of claim 12, wherein said barrier layer includes an $InAs_ySb_{1-y}$ doped layer.

20. The high electron mobility device of claim 12, wherein said high electron mobility transistor operates at a frequency on the order of 500 GHz, wherein said substrate comprises a thickness of 500 to 25 μm; said buffer layer comprises a thickness of 0.5 to 3 μm; said channel layer comprises a thickness of 50-300 Å; said barrier layer comprises a thickness of 20-600 Å, said silicon or tellurium doped layer in said barrier layer comprises a thickness of 0-50 Å; and said cap layer comprises a thickness of 20-800 Å.

* * * * *